(12) United States Patent
Hara et al.

(10) Patent No.: US 11,750,204 B2
(45) Date of Patent: Sep. 5, 2023

(54) ATOMIC RESONATOR

(71) Applicants: National Institute of Information and Communications Technology, Tokyo (JP); Tokyo Institute of Technology, Tokyo (JP)

(72) Inventors: Motoaki Hara, Tokyo (JP); Yuichiro Yano, Tokyo (JP); Masatoshi Kajita, Tokyo (JP); Tetsuya Ido, Tokyo (JP); Hiroyuki Ito, Tokyo (JP)

(73) Assignees: National Institute of Information and Communications Technology, Tokyo (JP); Tokyo Institute of Technology, Tokyo (JP)

( * ) Notice: Subject to any disclaimer, the term of this patent is extended or adjusted under 35 U.S.C. 154(b) by 0 days.

(21) Appl. No.: 17/692,742

(22) Filed: Mar. 11, 2022

(65) Prior Publication Data
US 2022/0200612 A1 Jun. 23, 2022

Related U.S. Application Data

(63) Continuation-in-part of application No. PCT/JP2020/033504, filed on Sep. 3, 2020.

(30) Foreign Application Priority Data

Sep. 13, 2019 (JP) .................................. 2019-167770

(51) Int. Cl.
*H03L 7/26* (2006.01)
*G04F 5/14* (2006.01)

(52) U.S. Cl.
CPC ................ *H03L 7/26* (2013.01); *G04F 5/145* (2013.01)

(58) Field of Classification Search
CPC ....................................................... H03L 7/26
(Continued)

(56) References Cited

U.S. PATENT DOCUMENTS

2006/0017519 A1 1/2006 Pernia et al.
2007/0205837 A1 9/2007 McCorquodale et al.
(Continued)

FOREIGN PATENT DOCUMENTS

JP 2003188717 A 7/2003
JP 2007531404 A 11/2007
(Continued)

OTHER PUBLICATIONS

Brannon et al., "Self-Injection Locking of a Microwave Oscillator by Use of Four-Wave Mixing in an Atomic Vapor", IEEE, 2007, 275-278.
(Continued)

*Primary Examiner* — Joseph Chang
(74) *Attorney, Agent, or Firm* — GRUMBLES LAW PLLC; Brittany Haanan (57) ABSTRACT

This atomic resonator for causing a resonance frequency by CPT resonance includes: a gas cell having alkali metal atoms enclosed; a photodetector configured to detect light having passed through the gas cell and convert the light to an electric signal; a high-frequency oscillator configured to receive the electric signal and output the signal after a frequency thereof is divided by two; and a laser light source configured to modulate and introduce, into the gas cell, light based on the signal output from the high-frequency oscillator. The high-frequency oscillator has an injection-locked frequency divider circuit including an acoustic resonator as an oscillation element.

8 Claims, 6 Drawing Sheets

(58) Field of Classification Search
USPC .......................................................... 331/3
See application file for complete search history.

(56) References Cited

U.S. PATENT DOCUMENTS

| | | | |
|---|---|---|---|
| 2009/0256638 A1* | 10/2009 | Rosenbluh | H03L 7/26 |
| | | | 331/3 |
| 2012/0112808 A1 | 5/2012 | Yotsuji | |

FOREIGN PATENT DOCUMENTS

| | | |
|---|---|---|
| JP | 2011160279 A | 8/2011 |
| JP | 2014179972 A | 9/2014 |
| JP | 2019007763 | 1/2019 |

OTHER PUBLICATIONS

Denatale et al., "Compact, Low-Power Chip-Scale Atomic Clock", IEEE, 2008, 67-70.

Deval et al., "HiperLAN 5.4-GHz Low-Power CMOS Synchronous Oscillator", IEEE Transacations on Microwave Theory and Techniques, Sep. 2001, vol. 49, No. 9, 1525-1530.

International Search Report and Written Opinion pertaining to PCT/JP2020/033504, dated Oct. 13, 2020.

Lutwak et al., "The MAC—a Miniature Atomic Clock", Symmetricom-Technology Realization Center, Charles Stark Draper Laboratory and Sandia National Laboratories, supported by the Defense Advanced Research Products Agency, Contract # NBCHC020050.

Rategh et al., "Superharmonic Injection-Locked Frequency Dividers", IEEE Journal of Solid-State Circuits, Jun. 1999, vol. 34, No. 6, 813-821.

Razavi, B., "A Study of Injection Locking and Pulling in Oscillators", IEEE Journal of Solid-State Circuits, Sep. 2004, vol. 39, No. 9, 1415-1424.

Vukicevic et al., "Compact Diode-Laser Based Rubidium Frequency Reference", IEEE Transactions on Ultrasonics, Ferroelectrics, and Frequency Control, Sep. 2000, vol. 47, No. 5, 1122-1126.

\* cited by examiner

ATOMIC RESONATOR

CROSS REFERENCE TO RELATED APPLICATIONS

This is a continuation-in-part of Application No. PCT/JP2020/033504, filed Sep. 3, 2020, which claims priority to Japanese Patent Application No. 2019-167770, filed Sep. 13, 2019.

DESCRIPTION

Technical Field

The present invention relates to an atomic resonator.

Background Art

Examples of an atomic resonator include a small atomic frequency standard that utilizes coherent population trapping (CPT; quantum interference effect) resonance and is used for, for instance, an atomic clock, an inertial sensor or magnetic sensor using atomic resonance. The atomic resonator can provide a stable frequency to the outside by controlling and locking a local oscillator to the resonance caused by a difference in the energy level of each alkali metal atom. In the CPT-based atomic resonator, the alkali metal atoms, which have been enclosed in a glass cell, are not necessarily irradiated with a microwave corresponding to the transition frequency. This allows for marked miniaturization. Unfortunately, the CPT-based atomic resonator has a low S/N ratio due to a weak signal (resonance signal) output from the atomic resonator system. Thus, it is essential to have a digital discriminator for generating, as a control signal of a local oscillator, an error signal produced from the difference between a resonance signal and an input high-frequency wave. In the atomic resonator system, the complicated digital discriminator with a lock-in amplifier has created a barrier for further miniaturization, lower power consumption, and reduced production cost. Then, an atomic resonator system without any digital discriminator has been studied.

Non-Patent Literature 1 discloses a method for direct feedback of atomic resonance so as to provide a self-oscillating atomic resonator system without a digital discriminator. In addition, a plurality of technologies for improving the S/N ratio of CPT resonance signal have recently been proposed. Patent Literature 1 discloses a method of increasing an S/N ratio by preventing detection of output noise light by Faraday effect. Non-Patent Literature 2 discloses a method including: acquiring a signal, in which CPT resonance with a high S/N ratio is mixed down into the RF band by using a high-speed photodetector; and feedbacking the signal to a drive current of a laser light source. Non-Patent Literature 3 discloses a CPT atomic clock module without a digital discriminator.

In addition, a high-frequency oscillator used for a local oscillator in an atomic resonator has been known to be provided with a low-frequency crystal oscillator for emitting a reference signal, so that the frequency is multiplied to give a high frequency (e.g., Patent Literature 2 and Non-Patent Literature 4). However, to make the atomic resonator compact, a high-frequency oscillator without any crystal oscillator has been sought.

Further, the high-frequency oscillator has been made efficient by providing a frequency divider circuit, in which the frequency of resonance signal is divided by two, and generating and feedbacking a modulation signal to a laser light source. Generally speaking, a technique for dividing the frequency of a high-frequency wave has been known in which a phase locked loop (PLL) circuit (phase-locked circuit) is used and the frequency of a high-frequency wave signal in a microwave range is divided by two and then output. The PLL circuit primarily includes a phase comparator, a loop/filter, and an LC resonance-based digital controlled oscillator (DCO; digital controlled oscillation circuit). Then, the phase of resonance signal is matched with the phase of LC oscillation, and as a result of which the frequency is divided. More specifically, the frequency of LC oscillation is multiplied digitally. Then, the resulting multiplied waveform and a resonance signal input to the PLL circuit are subject to phase comparison and are made to be in phase. As a result, the frequency is divided. Meanwhile, as another technique for dividing the frequency, a technology using an injection locked circuit has been developed for use in, for instance, wireless communication (see, for example, Non-Patent Literatures 5 to 7). This technology uses a phenomenon where an output frequency follows a frequency that is injected from the outside and is then divided by some integer because of a non-linear response of a semiconductor device, so that the frequency can be divided by two in a high-speed and stable manner. This frequency divider circuit includes, as components, an oscillation auxiliary circuit composed of an inductor, which is a passive element for supplying inductor properties (inductance characteristics), and an inverting amplifier, and a high-frequency wave injection port, and is thus quite simple.

CITATION LIST

Patent Literature

Patent Literature 1: JP-B-6346446
Patent Literature 2: JP-A-2019-7763

Non Patent Literature

Non-Patent Literature 1: N. Vuklevic et. al., "Compact diode-laser based rubidium frequency reference", Proceedings of the 1999 Joint Meeting of the European Frequency and Time Forum and the IEEE International Frequency Control Symposium, pp. 133-136, 1999

Non-Patent Literature 2: A. Brannon et. al., "Self-Injection Locking of a Microwave Oscillator by Use of Four-Wave Mixing in an Atomic Vapor", 2007 IEEE International Frequency Control Symposium Joint with the 21st European Frequency and Time Forum, pp. 275-278, 2007

Non-Patent Literature 3: J. F. DeNatale et. al., "Compact, low-power chip-scale atomic clock", Proceedings of the IEEE/ION Position, Location and Navigation Symposium, Monterey, USA, p. 67, July 2008

Non-Patent Literature 4: R. Lutwak et. al., "The MAC—A miniature atomic clock", in Proc. IEEE Int. Freq. Cont. Symp. 2005, pp. 752-757, August 2005

Non-Patent Literature 5: H. R. Rategh, T. H. Lee, "Superharmonic Injection-Locked Frequency Dividers", IEEE Journal of Solid-State Circuits, Vol. 34, No. 6, pp. 813-821, June 1999

Non-Patent Literature 6: B. Razavi, "Study of Injection Locking and Pulling in Oscillators", IEEE Journal of Solid-State Circuits, Vol. 39, No. 9, pp. 1415-1424, September 2004

Non-Patent Literature 7: Y. Deval et. al., "HiperLAN 5.4-GHz Low-Power CMOS Synchronous Oscillator", IEEE Transactions on Microwave Theory and Techniques, Vol. 49, No. 9, pp. 1525-1530, September 2001

SUMMARY OF INVENTION

Technical Problem

Unfortunately, the method disclosed in Non-Patent Literature 1 does not have an increased S/N ratio of CPT resonance signal, and Non-Patent Literature 1 has just provided a proposal in the block diagram. In the technology disclosed in Patent Literature 1, the S/N ratio is insufficient and a lock-in amplifier is required. The technologies disclosed in Non-Patent Literatures 2 and 3 fail to disclose actual characteristics of atomic resonator operation.

In addition, in the frequency divider circuit, a technique using the PLL circuit may be used. Here, when a phase jump in an atomic resonant system occurs due to an optical system, it takes a considerable time to follow. Further, there is a risk of out-of-control. In the technique using the injection locked circuit, the Q value of inductor in an oscillation auxiliary circuit is about 10 and is low. This makes it possible to broadly secure the input signal frequency locked range (lock range) to more than 10% of the input signal frequency (Non-Patent Literature 5). On the other hand, the locked state has low stability, and it takes time to reach the locked state. As a result, like the technique using the PLL circuit, it takes a considerable time to follow when a phase jump occurs. Because of the above, in the frequency divider circuit using any of the techniques, it is difficult to obtain a stable modulation signal when a CPT resonance signal with a low S/N ratio is directly input.

The present invention has been made in view of the above problems, and addresses the problem of providing an atomic resonator allowing for miniaturization and low power consumption and having enhanced phase noise characteristics and favorable frequency stabilization.

Solution to Problem

The present inventors have conceived of applying, instead of an inductor, an acoustic resonator having a high Q value, as a passive element with inductor properties in an oscillator auxiliary circuit, with respect to an injection-locked frequency divider (ILFD) using an injection-locked circuit because an atomic resonator operates in a narrow frequency range.

The present invention provides an atomic resonator for causing a resonance frequency by CPT resonance, comprising;
 a gas cell filled with alkali metal atoms;
 a photodetector configured to detect light having passed through the gas cell and convert the light to an electric signal;
 a high-frequency oscillator configured to receive the electric signal from the photodetector, frequency-divide the electric signal by two, and output a signal; and
 a laser light source configured to modulate and introduce, into the gas cell, light based on the signal output from the high-frequency oscillator, wherein the high-frequency oscillator has an injection-locked frequency divider circuit including an acoustic resonator as an oscillation element.

Such a configuration makes it possible for this atomic resonator to stably produce, without any digital discriminator, a modulation signal with enhanced phase noise characteristics from a resonance signal.

Advantageous Effects of Invention

The present invention provides an atomic resonator allowing for miniaturization and low power consumption and having enhanced phase noise characteristics and favorable frequency stabilization.

BRIEF DESCRIPTION OF DRAWINGS

FIGS. 3A and 3B show each output signal spectrum of a frequency divider circuit in a high-frequency oscillator installed in this atomic resonator.

DESCRIPTION OF EMBODIMENTS

Embodiments of an atomic resonator according to the invention will be described with reference to the Drawings. The size and positional relationship of an atomic resonator or each element depicted in the Drawings may be exaggerated in order to make the description clear. Also, the shape may be simplified. In addition, the same or equivalent structural elements have the same reference signs.

[Atomic Resonator]

Figure 1:
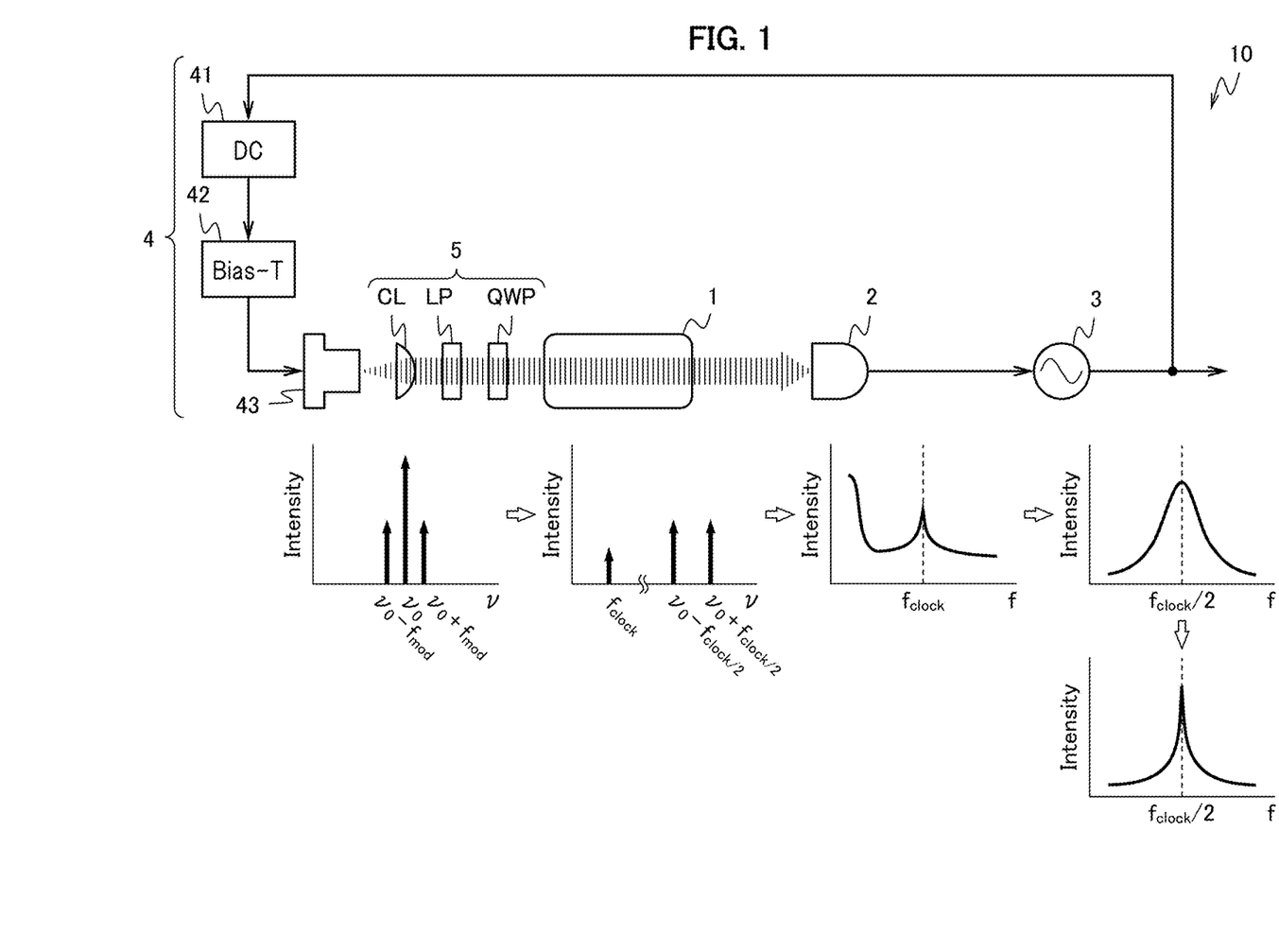
FIG. 1 is a block diagram illustrating the structure of an atomic resonator according to an embodiment of the invention.

As shown in FIG. 1, an atomic resonator 10 according to an embodiment of the invention includes: a gas cell 1 having alkali metal atoms enclosed; a photodetector 2 configured to detect light having passed through the gas cell 1 and convert the light to an electric signal; a high-frequency oscillator 3 configured to receive the electric signal and output the signal after a frequency thereof is divided by two; a laser light source 4 configured to modulate and introduce, into the gas cell 1, light based on the signal output from the high-frequency oscillator 3, the atomic resonator further including an optical system 5 configured to convert the light emitted by the laser light source 4. Then, the high-frequency oscillator 3 has an injection-locked frequency divider circuit 31 including an acoustic resonator as an oscillation element (see FIGS. 2A and 2B). In addition, the atomic resonator 10 may be optionally provided with a solenoid coil wound around the gas cell 1 so as to apply, to the gas cell 1, a magnetic field in an optical axis direction, thereby controlling a bias magnetic field in the gas cell 1, and a magnetic shield for shielding the outside magnetic field such as terrestrial magnetism (not shown). The atomic resonator 10 may be used as an atomic clock such that light injected by the laser light source 4 causes CPT resonance in the gas cell 1; an electric signal that is locked to the resonance frequency and is output from the high-frequency oscillator 3 is feedback, as a modulation signal, to the laser light source 4; and the electric signal is output, as a frequency reference signal, to the outside. The atomic resonator 10 can be implemented without any conventionally equipped digital discriminator and is a self-oscillating atomic resonator in which the resonance signal detected by the photodetector 2 is directly input into the high-frequency oscillator 3 and is locked. Note that in FIG. 1, the solid line arrow schematically denotes an electric signal and the hatched arrow schematically denotes light. The following details each component.

(Laser Light Source, Optical System)

The laser light source 4 emits light that induces optical transition of an alkali metal atom, which has been filled in the gas cell 1, from a ground state to an excited state. For example, in the case of $^{87}$Rb D1 line, light at a wavelength of 795 nm is emitted. Further, this light is provided with two sideband waves such that the difference frequency corresponds to the transition frequency $f_{clock}$ of the alkali metal atom. Note that the transition frequency $f_{clock}$ represents a difference in energy between two ground levels of the alkali metal atom. Thus, the light of the laser light source 4 is modulated with a frequency $f_{mod}$ ($f_{mod}=f_{clock}/2$) based on the modulation signal output from the high-frequency oscillator 3. The laser light source 4 includes: a laser element 43; a current source 41 configured to supply a current so that the laser element 43 can emit light with a given wavelength; and a bias circuit 42. The laser element 43 emits light with a wavelength corresponding to optical transition of the alkali metal atom as described above. For example, a Vertical Cavity Surface Emitting Laser (VCSEL) is applicable. For example, the optical system 5 includes, from the light incident side, a collimator (CL), a polarizing plate (linear polarizer; LP), and a quarter-wavelength plate (λ/4 plate, QWP). The light emitted by the laser element 43 is made parallel light with a diameter corresponding to the gas cell 1. The light is further circularly polarized and then injected into the gas cell 1.

(Gas Cell)

The gas cell 1 is an atomic resonance system in the atomic resonator 10. The light-permeable cell filled with alkali metal atoms in a gas state and buffer gas. Light from the laser element 43 of the laser light source 4 is introduced into the gas cell 1. Part of the light is absorbed by the alkali metal atoms, and the transmitted light is then injected into the photodetector 2. The cell may be, in particular, small, and may be structured by, for example, interposing, between two glass plates, a silicon substrate that has a through-hole with a diameter of several mm and having a thickness of 1 to several mm. Then, one of the glass plates for the gas cell 1 faces the laser element 43 of the laser light source 4 and the optical system 5. The other glass plate faces the photodetector 2. The alkali metal atoms used are cesium ($^{133}$Cs) or rubidium ($^{85}$Rb, $^{87}$Rb). Rubidium is preferable because the gas cell 1 can be made compact. When irradiated with light having a specific wavelength, the alkali metal atoms enclosed in the gas cell 1 absorb the light and are subject to transition from a ground state to an excited state. In addition, this light with a specific wavelength may be accompanied by two sideband waves with a difference frequency corresponding to the transition frequency $f_{clock}$ of the alkali metal atom. In this case, transmitted light that is not absorbed by the alkali metal atoms is intensified at the transition frequency $f_{clock}$. The transition frequency $f_{clock}$ is about 6.8 GHz for $^{87}$Rb, about 3.0 GHz for $^{85}$Rb, and about 9.2 GHz for $^{133}$Cs.

The buffer gas is contained to suppress the effect caused by a shortened relaxation time of excited level life due to alkali metal atom collision to the cell wall surface. Inert gas such as nitrogen or argon gas is applicable.

(Photodetector)

The photodetector 2 is configured to convert light having passed through the gas cell 1 to an electric signal and output the electric signal as a resonance signal. The photodetector 2 is a photodiode fit for a wavelength range of the light emitted by the laser light source 4. Here, a high-sensitivity one is preferable. The photodetector 2 further has a sufficiently high response speed, so that a microwave near the frequency $f_{clock}$ is extracted to give a noise-less signal.

(High-Frequency Oscillator)

Figure 2A:
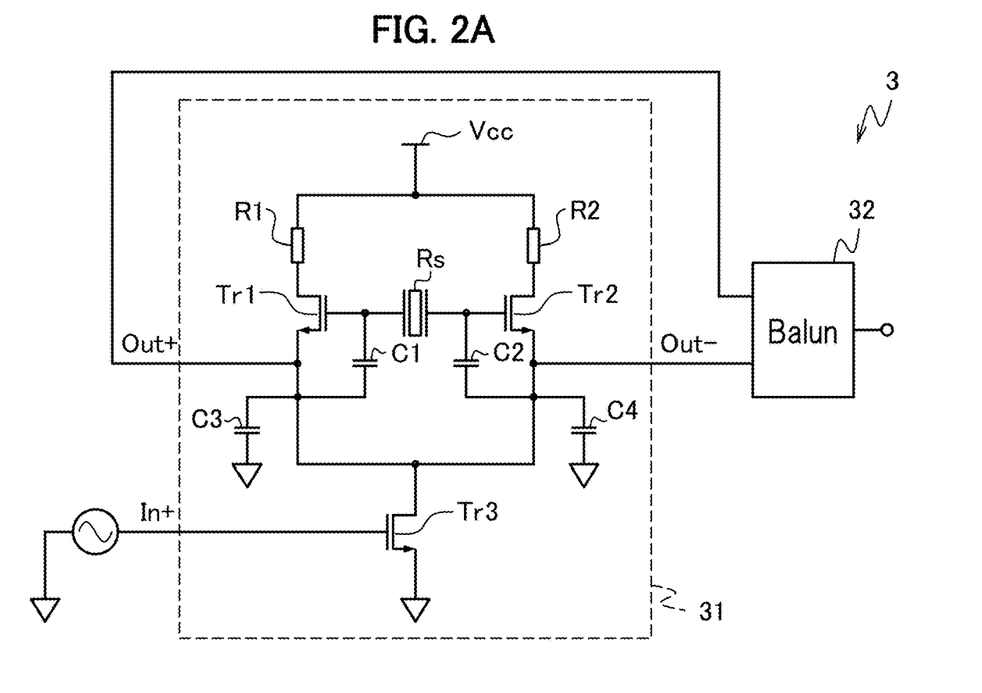
FIG. 2A is an example of an equivalent circuit diagram of an high-frequency oscillator in the atomic resonator according to this embodiment.

The high-frequency oscillator 3 is a local oscillator in the atomic resonator 10. A resonance signal is input from the photodetector 2. The oscillation is locked to this signal to provide a stable frequency to the outside. Also, a modulation signal for the laser light source 4 is output. The high-frequency oscillator 3 includes a frequency divider circuit 31 as shown in FIG. 2A. The frequency divider circuit 31 is a balanced output circuit having two output ports Out+ and Out−, and is further provided with a Balun circuit 32 in which these two outputs are united and output from the high-frequency oscillator 3. Meanwhile, the input port In+ of the frequency divider circuit 31 receives the resonance signal output from the photodetector 2. The high-frequency oscillator 3 may further include an impedance matching circuit. This impedance matching circuit (not shown) may be connected to the input side of the frequency divider circuit 31 and/or between the frequency divider circuit 31 and the Balun circuit 32.

The frequency divider circuit 31 is a circuit configured to output the input electric signal after the frequency is divided by two, and may have substantially the same circuit configuration as of ILFD using an inductor. For example, as shown in FIG. 2A, the frequency divider circuit 31 may include an acoustic resonator Rs (in the figure, depicted as an oscillator figure symbol), three N-ch transistors Tr1 to Tr3, two resistors R1, R2, and four capacitors C1 to C4. Specifically, the first and second transistors Tr1, Tr2 are each connected to the common potential via a resistor R1 (R2) on the drain side. Also, the acoustic resonator Rs is connected between the two gates. In addition, for the first transistor Tr1 and the second transistor Tr2, each gate is connected to the corresponding source via a capacitor C1 (C2). For the third transistor Tr3, the gate is connected to the input port In+. The drain branches to be connected to the source of the first transistor Tr1 or the second transistor Tr2. Each common node between the drain of the third transistor Tr3 and the source of the first or second transistor is connected via a capacitor C3 (C4) to the source potential of the third transistor Tr3, and is connected to the output port Out+ or Out−. Such a frequency divider circuit 31 includes, as a component, an NMOS single channel, so that the production cost can be reduced.

Figure 3A:
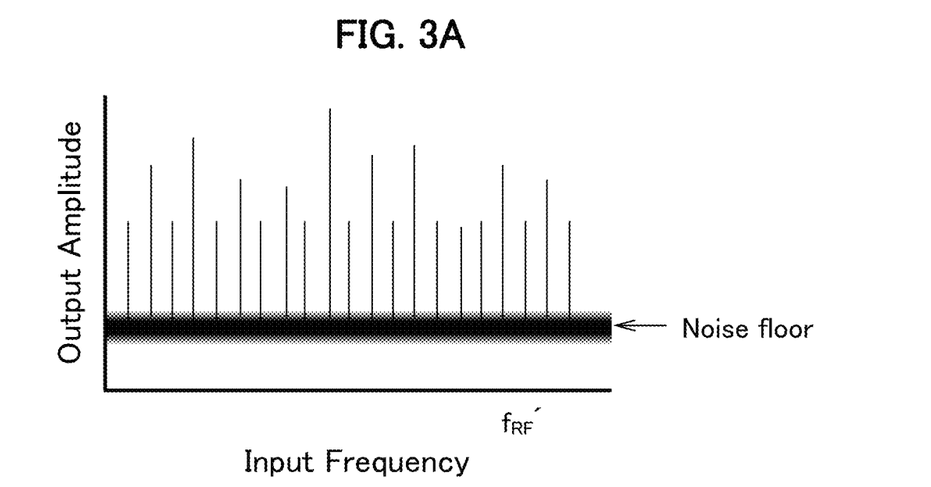
FIG. 3A shows an unlocked state.
Figure 3B:
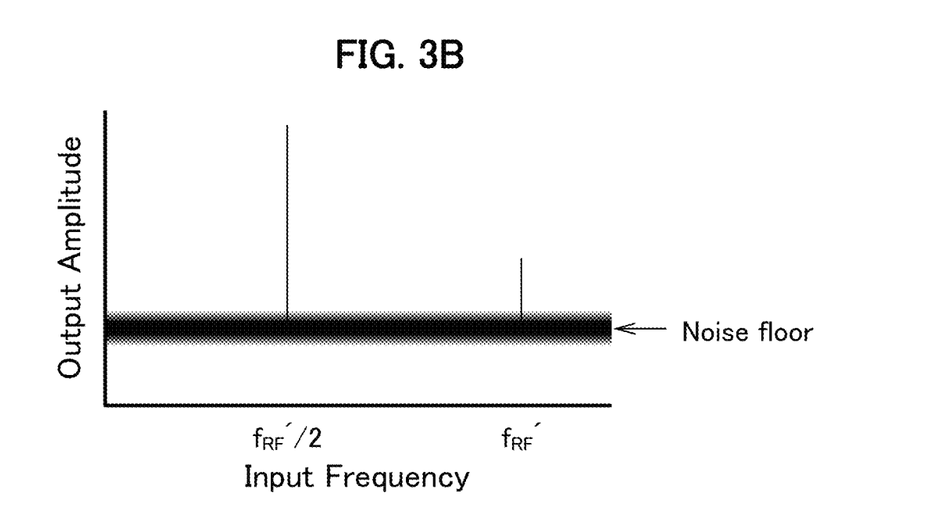
FIG. 3B shows a locked state.

The acoustic resonator Rs has a non-linear characteristic. A high-frequency wave with a frequency about two times the frequency of a fundamental wave of the acoustic resonator may be input to terminals on both sides. In this case, the oscillation near the fundamental wave after the frequency is divided by two is strongly induced, but not the input high-frequency wave. The oscillation with the frequency divided by two is in a resonance frequency range of the acoustic resonator Rs. That is, the input frequency range, in which the frequency divided by two can be exhibited, is two times the resonance frequency range. The acoustic resonator Rs of the frequency divider circuit 31 is designed such that the resonance frequency range encompasses a frequency ($f_{clock}/2$) half the transition frequency $f_{clock}$ of the alkali metal atom enclosed in the gas cell 1. The acoustic resonator Rs used may be any of a surface acoustic wave (SAW) resonator or a bulk acoustic wave (BAW) resonator. The surface acoustic wave resonator is structured by having a comb-shaped electrode formed on a piezoelectric substrate, so that the production is easy. The pitch of the comb-shaped electrode is used to set the resonance frequency. On the other hand, the bulk acoustic wave resonator is structured by having both surfaces of a piezoelectric thin film sandwiched between electrodes. Then, the film thickness of the piezoelectric thin film is used to set the resonance frequency. The bulk acoustic wave resonator has a higher Q value and better heat dissipation than the surface acoustic wave resonator. Further, the bulk acoustic wave resonator can be formed on a silicon substrate having a semiconductor circuit including a transistor(s) constituting an inverting amplifier of the frequency divider circuit 31. Thus, the high-frequency oscillator 3 can be miniaturized. Among bulk acoustic wave resonators, particularly preferred is a piezoelectric thin Film Bulk Acoustic Resonator (FBAR) that has a particularly high Q value of 1000 or more and is produced by Micro Electro Mechanical Systems (MEMS) technology fit for a semiconductor circuit. The frequency divider circuit 31 receives the input signal (resonance signal) with a transition frequency $f_{clock}$ of several GHz. The corresponding lock range is about 100 MHz or narrower, or may be 1% or less of the transition frequency $f_{clock}$. Thus, the acoustic resonator Rs with a high Q value can be a passive element with inductor properties. If the atomic resonator 10 is used as an atomic clock while the temperature and/or magnetic field, etc., are controlled, the lock range may be narrow. Inclusion of the acoustic resonator Rs permits the frequency divider circuit 31 to output a $f_{RF}/2$ signal when a signal with the frequency $f_{RF'}$ is input. Note that as shown in FIG. 3B, the output signal of the frequency divider circuit 31 includes the input signal frequency $f_{RF'}$ with a small amplitude.

The high-frequency oscillator 3 has a simple configuration, so that the size can be made as small as or smaller than the size of the gas cell 1. Also, the power consumption is low, so that the high-frequency oscillator 3 can be installed near the gas cell 1. Such a configuration makes it possible for the high-frequency oscillator 3 to heat the gas cell 1 at a stable temperature to maintain the alkali metal atoms in a gas state. As a result, the atomic resonator 10 can be implemented without a heater for heating the gas cell 1.

[How to Stabilize Frequency in Atomic Resonator]

Hereinbelow, how to stabilize the frequency in the atomic resonator 10 will be described with reference to FIG. 1. Note that FIG. 1 depicts, from the left, the spectrum of the vibration frequency v or the frequency f of light emitted by the laser light source 4, light having passed through the gas cell 1, an electric signal output from the photodetector 2, and (upper panel) an electric signal with a frequency divided in the high-frequency oscillator 3 and (lower panel) an electric signal output from the high-frequency oscillator 3. Each spectrum intensity (ordinate) is independent from one another.

Light from the laser light source 4 is modulated, based on the signal from the high-frequency oscillator 3, such that in order to correspond the difference frequency to the transition frequency $f_{clock}$ of the alkali metal atom, the light is modulated with the half frequency $f_{mod}$ ($f_{mod}=f_{clock}/2$) and is emitted with two sideband waves of $v_0 \pm f_{mod}$ ($f_{mod}=f_{clock}/2$).

This light is circularly polarized via the optical system 5 to be introduced into the gas cell 1. In the light having passed through the gas cell 1, light with a vibration frequency $v_0$ disappears due to absorption by the alkali metal atoms while the light has a peak at the frequency $f_{clock}$. This light is converted to an electric signal in the photodetector 2. At this time, light not followed by the photodetector 2 is output as an intensity signal in the DC range.

The electric signal (resonance signal) from the photodetector 2 is input into the frequency divider circuit 31 of the high-frequency oscillator 3. The resonance signal has a peak at the frequency $f_{dock}$ as described above. However, the peak has a relatively low intensity as shown in FIG. 1. In addition, the signal has a low S/N ratio and contains noise outside the frequency $f_{clock}$. In the frequency divider circuit 31, the acoustic resonator Rs, which is an element with inductor properties, has a high Q value. Thus, the lock range is narrow. Here, the resonance signal peak range is limited to and is narrowed between several hundred Hz and several kHz. Accordingly, the resonance signal can be locked. Further, noise can be removed. Furthermore, in the frequency divider circuit 31, the acoustic resonator Rs has a high Q value. Thus, as shown in FIG. 1, the signal is rapidly followed by a full-width half-maximum (FWHM) narrow peak at the frequency $f_{clock}/2$. Specifically, it is possible to output a signal with small phase noise. Then, the locked state is stable and is not easily unlocked. The signal output from the high-frequency oscillator 3 is provided to the outside as a frequency reference signal and is also input, as a modulation signal, to the current source 41 of the laser light source 4.

In this way, the atomic resonator 10 is simply configured such that the high-frequency oscillator 3 is provided with an acoustic resonator Rs having a high Q value in the frequency divider circuit 31, and can output a stable frequency. Note that an increase in electric power input to the frequency divider circuit 31 can widen the lock range according to the Q value of the acoustic resonator Rs.

The high-frequency oscillator 3 can be implemented without a Balun circuit 32, and may send, to the laser light source 4 or the outside, the output signal only from the output port Out+ or Out− of the frequency divider circuit 31. In addition, in the case where the laser element 43 of the laser light source 4 is of balanced input type, the signal from each of the output port Out+ or Out− of the frequency divider circuit 31 may be input into the laser light source 4.

Figure 2B:
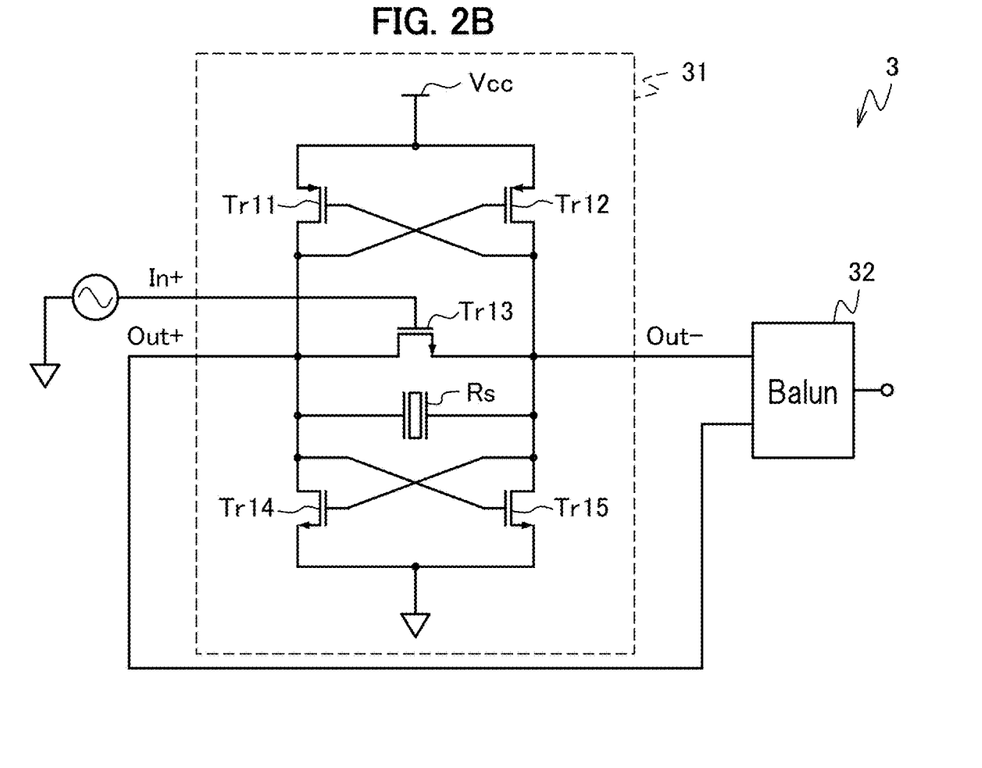
FIG. 2B is another example of an equivalent circuit diagram of an high-frequency oscillator in the atomic resonator according to this embodiment.

As described above, the frequency divider circuit 31 of the high-frequency oscillator 3 may have substantially the same circuit configuration as of a known ILFD. Another example of the frequency divider circuit 31 may include an acoustic resonator Rs, three N-ch transistors Tr13, to Tr15, and two P-ch transistors Tr11, Tr12 as shown in FIG. 2B. The first N-ch transistor Tr14 and the second N-ch transistor Tr15 share the source potential while the gate of one transistor is connected to the drain of the other transistor Tr15, Tr14 to form a cross-coupled transistor pair. Also, the fourth P-ch transistor Tr11 and fifth P-ch transistor Tr12 share the source potential while the gate of one transistor is connected to the drain of the other transistor Tr12 (Tr11) to form a cross-coupled transistor pair. Then, the respective drains of the first transistor Tr14 and the fourth transistor Tr11 and the third N-ch transistor Tr13 are connected, and the common node is connected to the output port Out+. Meanwhile, the respective drains of the second transistor Tr15 and the fifth transistors Tr12 and the source of the third transistor Tr13 are connected, and the common node is connected to the output port Out−. In addition, the gate of the third transistor is connected to the input port In+. The acoustic resonator Rs is connected in parallel to the third transistor Tr13.

In the atomic resonator 10, the optical system 5 may include no quarter-wavelength plate. Linearly polarized light may be injected into the gas cell 1. In this case, a polarizing plate with an absorption axis not in parallel to that of the polarizing plate of the optical system 5 is arranged between the gas cell 1 and the photodetector 2 (Patent Literature 1). Depending on the size and/or the arrangement, etc., of the gas cell 1 and the high-frequency oscillator 3, the atomic resonator 10 may include a heater for heating the gas cell 1 at a given temperature and a thermometer device. In addition, the gas cell 1 is not limited to the structure in which light can pass through in one direction while both sides are each provided with an window (glass plate), and may be provided with a light-reflecting film on a side opposite to the laser light source 4 arrangement side. In the case of having such a gas cell 1, the atomic resonator 10 has a circulator between the gas cell 1 and the optical system 5. Output light having passed through the gas cell 1 is then injected into the photodetector 2.

Figure 4:
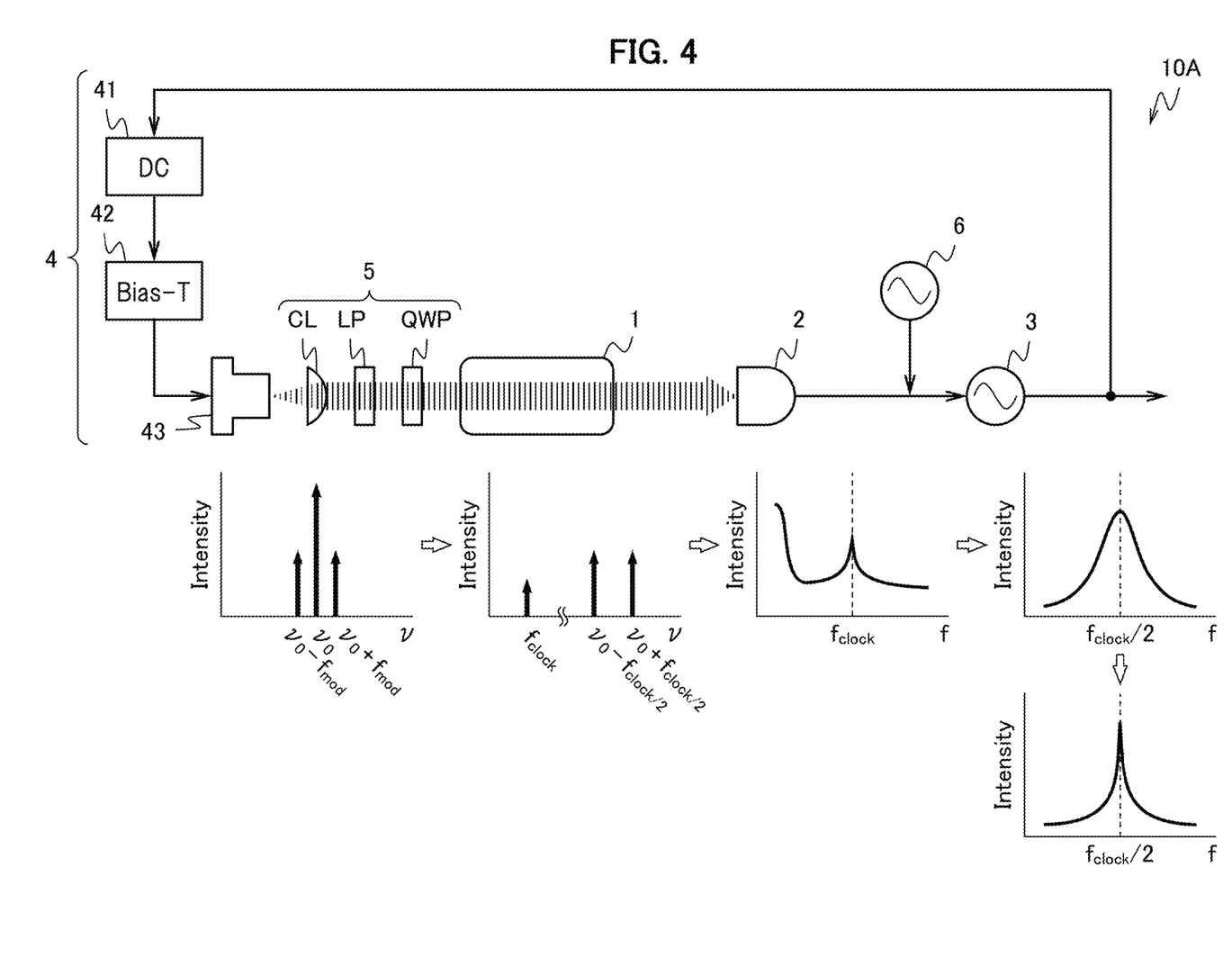
FIG. 4 is a block diagram illustrating the structure of an atomic resonator according to another embodiment of the invention.

In the atomic resonator 10 according to this embodiment, the frequency divider circuit 31 of the high-frequency oscillator 3 has a narrow lock range. Accordingly, the resonance signal from the photodetector 2 is locked to a narrow FWHM peak at the frequency $f_{clock}/2$. Further, the locked state is highly stable and a signal with less phase noise can be continuously output. On the other hand, while the atomic resonator 10 is in an unlocked state at the time of starting, for example, it may take a long time (lock-up time) until the locked state is established. Then, as an embodiment in which the resonance signal is easily locked from an unlocked state rapidly, another embodiment of the atomic resonator according to the invention will be described below with reference to FIG. 4. The same elements as in the above embodiment (see FIGS. 1, 2A, 2B, 3A, and 3B) have the same reference signs, and the description is omitted.

The atomic resonator 10A according to this embodiment is structured by additionally including a start-up oscillator 6 in the atomic resonator 10 according to the above embodiment. The start-up oscillator 6 outputs a start-up signal with a given intensity and a given frequency $f_{clock'}$ ($f_{clock'} \cong f_{clock}$) at or near the transition frequency $f_{clock}$ of the alkali metal atom enclosed in the gas cell 1. The signal is input into the high-frequency oscillator 3. Like the resonance signal from the photodetector 2, the start-up signal is input into the input port In+ of the frequency divider circuit 31 in the high-frequency oscillator 3 (see FIGS. 2A and 2B). The start-up oscillator 6 emits the start-up signal for a certain period at the time of, for example, starting the atomic resonator 10A as described later. Preferably, the intensity is gradually attenuated and the emission of the start-up signal is then stopped. The start-up oscillator 6 is preferably produced on the same chip with, for example, the high-frequency oscillator 3. Preferred is an LC oscillator or an oscillator using a piezoelectric thin film resonator.

Figure 5:
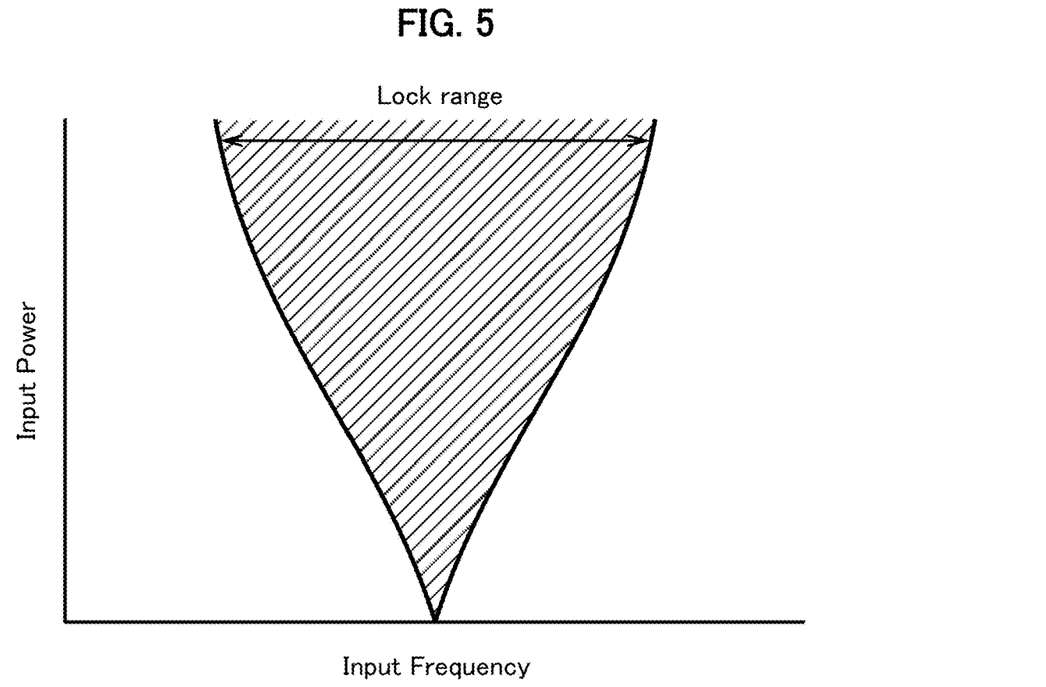
FIG. 5 is a chart illustrating a lock range of a frequency divider circuit in a high-frequency oscillator installed in this atomic resonator.
Figure 6:
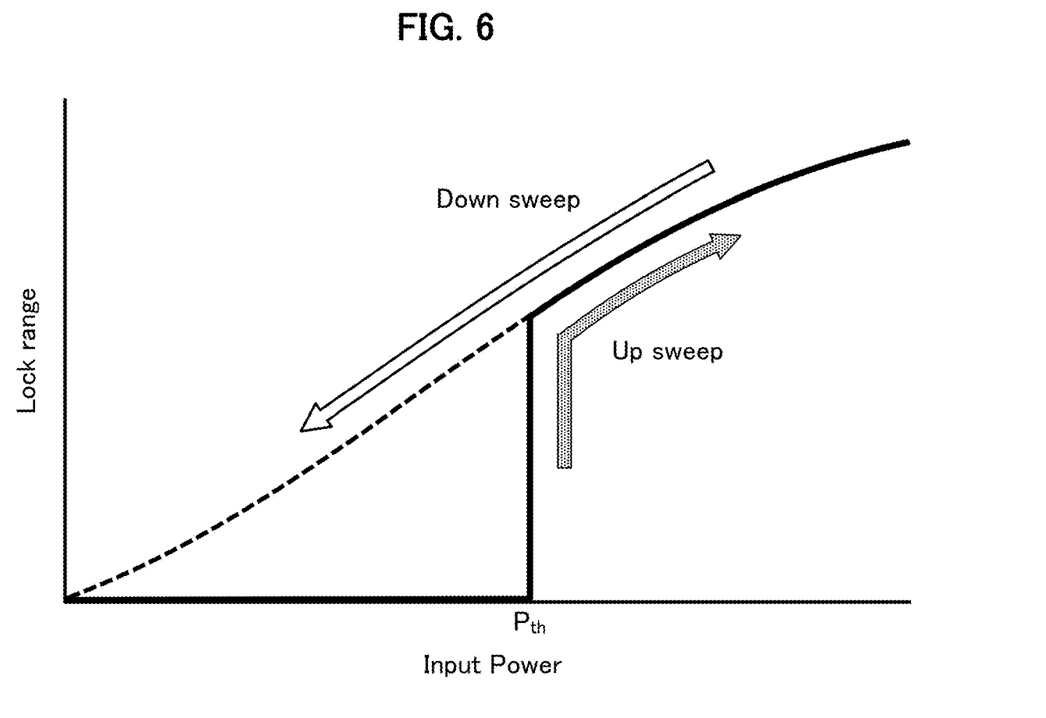
FIG. 6 is a graph illustrating transition of the lock range of a frequency divider circuit in a high-frequency oscillator installed in this atomic resonator.

Here, the signal input into the frequency divider circuit 31 is locked when the frequency and the intensity (output) are within a hatched range (lock range) in FIG. 5 (see FIG. 3B). By contrast, when the frequency and the intensity are out of the lock range, the signal is in an unlocked state. Then, the frequency divider circuit 31 outputs a signal with no peak at a specific frequency as shown in FIG. 3A. That is, as the intensity of the signal input into the frequency divider circuit 31 increases, the lock range becomes wider. Accordingly, a wider frequency can be locked. Note that the range in a locked state and the range in an unlocked state are not necessarily symmetric between the high-frequency wave side and the low-frequency wave side (symmetric between the left side and the right side). In this regard, however, in the frequency divider circuit 31 including the acoustic resonator Rs as an oscillation element, a signal included in the lock range may be input. In this case, the signal is not locked unless the intensity is a specific threshold or higher. As shown in FIG. 6, a signal with an intensity less than such a threshold $P_{th}$ may be input into the frequency divider circuit 31. In this case, when the inputting signal intensity is increased (up-sweep) and the intensity reaches the $P_{th}$, the state is changed to a locked state.

In view of this, the frequency divider circuit 31 cannot output the resonance signal with the frequency divided by two until the resonance signal output from the photodetector 2 is stabilized and the intensity reaches $P_{th}$ or higher immediately after the atomic resonator 10A (10) is started. The resonance signal should be locked rapidly in the frequency divider circuit 31 immediately after starting. For this purpose, the resonance signal intensity should be made higher such that the resonance signal is output with an intensity of $P_{th}$ or higher immediately after starting. However, if the output of the laser light source 4 is made larger to increase the intensity of the resonance signal, a secondary response to resonance of each alkali metal atom enclosed in the gas cell 1 is likely to occur. As a result, the peak of vibration of light having passed through the gas cell 1 may be shifted from the transition frequency $f_{clock}$ of the alkali metal atom. Thus, a smaller output of the laser light source 4 is preferable. Although depending on the sensitivity of the photodetector 2, there is a limitation of increasing the intensity of the resonance signal.

On the other hand, the intensity may be decreased (down sweep) while the input signal is locked and continuously input. In this case, as shown in FIG. 6, the locked state remains even when the intensity is lower than $P_{th}$ and the lock range is decreased. Here, in the atomic resonator 10A according to this embodiment, the start-up oscillator 6 starts emitting a start-up signal with an intensity of $P_{th}$ or higher. If the intensity of the start-up signal is in the lock range of the frequency divider circuit 31, the frequency $f_{clock'}$ may drift. This makes it possible for the high-frequency oscillator 3 to output a signal with a frequency $f_{clock'}/2$ while in the frequency divider circuit 31, the start-up signal is locked and the frequency is divided by two immediately after starting the atomic resonator 10A. In the frequency divider circuit 31, the start-up signal is locked. Accordingly, if the resonance signal input, together with the start-up signal, from the photodetector 2 is in the lock range, the signal even with an intensity of less than $P_{th}$ is also locked. Thus, the resonance signal is locked in an early period. Then, after the start-up signal is stopped, the high-frequency oscillator 3 outputs the resonance signal with the frequency divided by two. Accordingly, the emission period of the start-up signal should be set such that the resonance signal is locked until the start-up signal is stopped.

It is preferable that the start-up oscillator 6 is stopped after the emission of the start-up signal is started and the intensity is then gradually attenuated. After the intensity of the start-up signal is lower than that of the resonance signal, the frequency divider circuit 31 outputs a signal with the frequency of the resonance signal divided by two. Thus, in the start-up oscillator 6, the start-up signal is gradually attenuated such that the resonance signal has already been locked at the time point when the intensity of the start-up signal is lower than that of the resonance signal.

The atomic resonator 10A according to this embodiment is configured in this way, so that a stable frequency reference signal can be output in an early period after starting. Further, in the frequency divider circuit 31, the start-up signal is locked earlier. As a result, even if the intensity of the resonance signal from the photodetector 2 is less than Pal, the signal is locked while the frequency is divided by two. Thus, the output of the laser light source 4 can be made smaller.

In the atomic resonator 10A according to this embodiment, implementation of the start-up oscillator 6 is not limited to the time of starting. The start-up oscillator 6 may be operated when the locked state of the resonance signal is unlocked during operation, and then a recovery process may be performed. Such an atomic resonator 10A further includes a control circuit including a filter configured to receive the output signal from the high-frequency oscillator 3 and remove unnecessary frequency components with a low pass filtering circuit or a band-pass filter thereof to output frequency components around (near) the frequency $f_{clock}/2$ of the signal output from the high-frequency oscillator 3 and a comparator. For instance, the comparator includes a voltage comparator supplied with a predetermined reference voltage, and the intensity of the output signal may be lower than a predetermined value.

Figure 7:
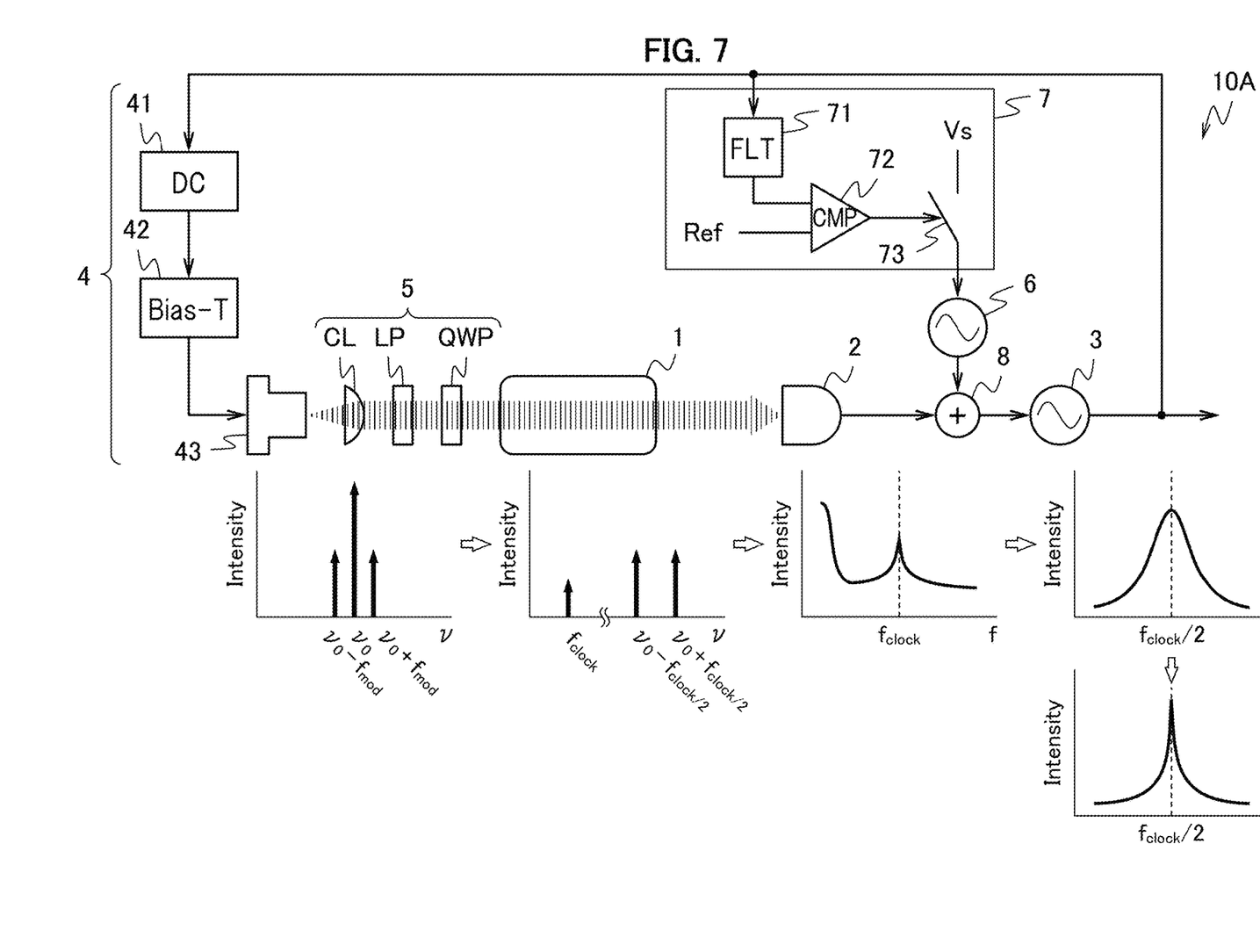
FIG. 7 is a block diagram illustrating the structure of an atomic resonator with a start-up oscillator according to an embodiment of the invention.

FIG. 7 is a block diagram illustrating the structure of an atomic resonator with the start-up oscillator 6 according to an embodiment of the invention in addition to the control circuit 7. The control circuit 7 controls the oscillation of the start-up oscillator 6, and the output of the start-up oscillator 6 is added to the output of the photodetector 2 by an adder 8. and the output of the high-frequency oscillator 3 is supplied to the input port In+ of the frequency divider circuit 31. However, it is possible to omit the adder 8 by supplying the output of the start-up oscillator 6 and the output of the photo detector 2 to the input port In+ of the frequency divider circuit 31 to add the output signals of the start-up oscillator 6 and the output signal of the photodetector 2 through impedance matching. Further, the adder may be a buffer circuit.

More specifically, the control circuit 7 of the atomic resonator 10A in this embodiment (FIG. 7) includes a filter a low-pass or a band-pass filtration function removing unnecessary frequency components and further includes a voltage comparator 72 and a switch 73 selectively supplies a supply voltage Vs to the start-up oscillator 6 to start oscillation in accordance with an output of the comparator 72.

The comparator 72 has a reference input Ref supplied with the reference signal, for example, a reference voltage Ref and a signal input for receiving the output of the filleter 71. When a voltage of the output signal of the filter 71 is lower than the reference voltage Ref, the switch 73 supplies the supply voltage Vs to the start-up oscillator 6 to start oscillation of the start-up-oscillator 6 because it can be detected that the output of the photodetector 2 has no oscillation signal of the frequency $f_{clock}$.

The oscillation frequency of the start-up oscillator 6 is substantially the same as the clock near the frequency $f_{clock}$. However, the frequency of the start-up oscillator 6 is set to a frequency slightly different from clock the frequency $f_{clock}$, the filter 71 can pass extremely near the frequency component $f_{clock}/2$ in the output signal of the photodetector 2, so that the comparator 72 can compare the level of only a half frequency of the frequency components $f_{clock}$ from the photodetector 2 with the reference value Ref (a reference voltage Ref) with removal of the frequency components from the start-up oscillator 6 to avoid influence of the oscillation signal from the start-up oscillator 6 to monitor the level of the oscillation signal $f_{clock}$ from the photodetector 2. Accordingly, the filter 71 can stop the oscillation of the start-up oscillator 6 when the level of the output signal of the filter 71 is equal or higher than the reference voltage Ref by controlling the switch 73 to stop supply of the supply voltage Vs to the start-up oscillator 6.

The atomic resonator 10 or 10A according to an embodiment of the invention may be used as a magnetic sensor. The magnetic field outside the gas cell 1 can cause a change in the transition frequency of the alkali metal atom. Accordingly, the outside magnetic field can be read from the frequency $f_{clock}/2$ of the signal output from the high-frequency oscillator 3 when CPT resonance occurs. Likewise, the atomic resonator 10 or 10A may be used as an inertial sensor.

Hereinabove, the atomic resonator according to each embodiment of the invention has been described. The invention, however, is not limited to the above embodiments. Various modifications are allowed within the scope defined in the Claims.

REFERENCE SIGNS LIST 10, 10A Atomic resonator
1 Gas cell
2 Photodetector
3 High-frequency oscillator
31 Frequency divider circuit
4 Laser light source
5 Optical system
6 Start-up oscillator

The invention claimed is:

1. An atomic resonator for causing a resonance frequency by CPT resonance, comprising;
   a gas cell filled with alkali metal atoms;
   a photodetector configured to detect light having passed through the gas cell and convert the light to an electric signal;
   a high-frequency oscillator configured to receive the electric signal from the photodetector, frequency-divide the electric signal by two, and output a signal;
   a laser light source configured to modulate and introduce, into the gas cell, light based on the signal output from the high-frequency oscillator,
   wherein the high-frequency oscillator has an injection-locked frequency divider circuit including an acoustic resonator as an oscillation element; and
   a start-up oscillator configured to temporarily output and send a start-up signal to the high-frequency oscillator, wherein
   in the high-frequency oscillator, a frequency of the start-up signal is divided by two.

2. The atomic resonator as claimed in claim 1, wherein the high-frequency oscillator is configured to receive the electric signal from the photodetector, frequency-divide the electric signal by two, and output another electric signal; and wherein the laser light source modulates and introduces, into the gas cell, light based on the another electric signal output from the high-frequency oscillator.

3. The atomic resonator as claimed in claim 2, wherein the laser light source is configured to generate a laser light modulated based on the another electrical signal and introduce the laser light to the cell.

4. The atomic resonator according to claim 1, wherein the acoustic resonator of the high-frequency oscillator is a surface acoustic wave resonator or a bulk acoustic wave resonator.

5. The atomic resonator according to claim 4, further comprising
- a control circuit, including a filter, the filter being configured to receive a signal output from the high-frequency oscillator to pass frequency components near a half of a transition frequency of the alkali metal atoms and output an output signal, wherein
- the control circuit controls, based on the signal output from the filter, the start-up oscillator to start oscillation for the start-up signal.

6. The atomic resonator according to claim 1, wherein the laser light source comprises a single laser element.

7. The atomic resonator as claimed in claim 1, wherein the electric signal that is locked to the resonance frequency and is output from the high-frequency oscillator is feedback, as a modulation signal, to the laser light source.

8. The atomic resonator according to claim 1, further comprising
- a control circuit, including a filter, the filter being configured to receive a signal output from the high-frequency oscillator to pass frequency components near a half of a transition frequency of the alkali metal atoms and output an output signal, wherein
- the control circuit controls, based on the signal output from the filter, the start-up oscillator to start oscillation for the start-up signal.

* * * * *